(12) United States Patent
Schelshorn et al.

(10) Patent No.: US 9,990,014 B2
(45) Date of Patent: Jun. 5, 2018

(54) FAN ASSEMBLY FOR A COMPUTER SYSTEM AS WELL AS HOLDING DEVICE FOR A FAN ASSEMBLY

(71) Applicant: FUJITSU LIMITED, Kawasaki-shi, Kanagawa (JP)

(72) Inventors: Lorenz Schelshorn, Augsburg (DE); Friedrich Köhler, Altenstadt (DE)

(73) Assignee: FUJITSU LIMITED, Kawasaki (JP)

(*) Notice: Subject to any disclaimer, the term of this patent is extended or adjusted under 35 U.S.C. 154(b) by 0 days. days.

(21) Appl. No.: 15/614,377

(22) Filed: Jun. 5, 2017

(65) Prior Publication Data
US 2017/0351307 A1   Dec. 7, 2017

(30) Foreign Application Priority Data
Jun. 7, 2016   (DE) .................. 10 2016 110 484

(51) Int. Cl.
*G06F 1/20* (2006.01)
*H05K 7/20* (2006.01)
*F04D 29/60* (2006.01)

(52) U.S. Cl.
CPC .............. *G06F 1/20* (2013.01); *F04D 29/601* (2013.01); *H05K 7/20172* (2013.01)

(58) Field of Classification Search
CPC ................................................ H05K 7/20172
USPC ....................................................... 361/695
See application file for complete search history.

(56) References Cited

U.S. PATENT DOCUMENTS

| | | | | |
|---|---|---|---|---|
| 7,583,498 B2 * | 9/2009 | Chen | ........................ | G06F 1/20 361/679.48 |
| 7,990,707 B2 * | 8/2011 | Hung | ........................ | G06F 1/183 361/694 |
| 8,218,319 B2 * | 7/2012 | Wu | ........................ | H01L 23/4093 165/121 |
| 2008/0107479 A1 * | 5/2008 | Yang | ........................ | H05K 7/20172 403/155 |
| 2009/0141449 A1 * | 6/2009 | Yeh | ........................ | H05K 7/20172 361/695 |
| 2010/0002389 A1 | 1/2010 | Tung et al. | | |
| 2011/0073731 A1 | 3/2011 | Li | | |
| 2012/0087790 A1 | 4/2012 | Zeng et al. | | |

(Continued)

FOREIGN PATENT DOCUMENTS

| | | |
|---|---|---|
| CN | 201854173 U | 6/2011 |
| DE | 20120225 | 4/2002 |
| TW | 200847902 A | 1/2008 |

OTHER PUBLICATIONS

Search Report dated Oct. 31, 2017 for Great Britain (U.K.) Patent Application No. GB1708773.5. **US2009/0141449A1, US2015/0282384A1 and US2012/0087790A1 were previously cited in the IDS.

*Primary Examiner* — Adrian S Wilson
(74) *Attorney, Agent, or Firm* — Fujitsu Patent Center

(57) ABSTRACT

A fan assembly for a computer system that includes a fan, which has a flange having at least three fastening openings; and a holding device with at least two spring-loaded first fastening elements and a second fastening element. The fastening elements are arranged relative to one another such that in a relaxed state of the first fastening elements, the fan can be placed on the holding device in a first manner such that only the first fastening elements engage into respective two fastening openings, and in a second manner against a spring force of the first fastening elements.

10 Claims, 3 Drawing Sheets

(56) References Cited

U.S. PATENT DOCUMENTS

Figure 1:
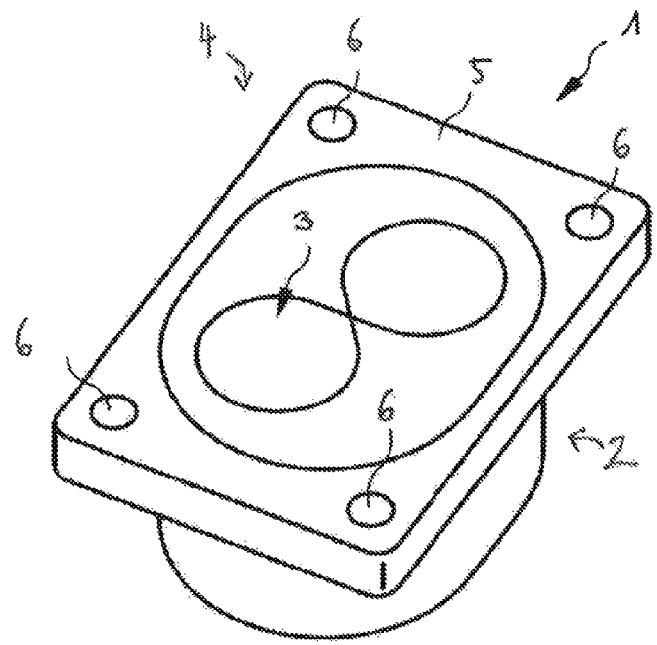

| | | | | |
|---|---|---|---|---|
| 2012/0195738 A1* | 8/2012 | Chan | ............... | H05K 7/20172 415/119 |
| 2015/0230013 A1* | 8/2015 | Wu | ............... | H04R 1/025 361/807 |
| 2015/0282384 A1* | 10/2015 | Ho | ............... | H05K 7/20172 361/695 |

* cited by examiner

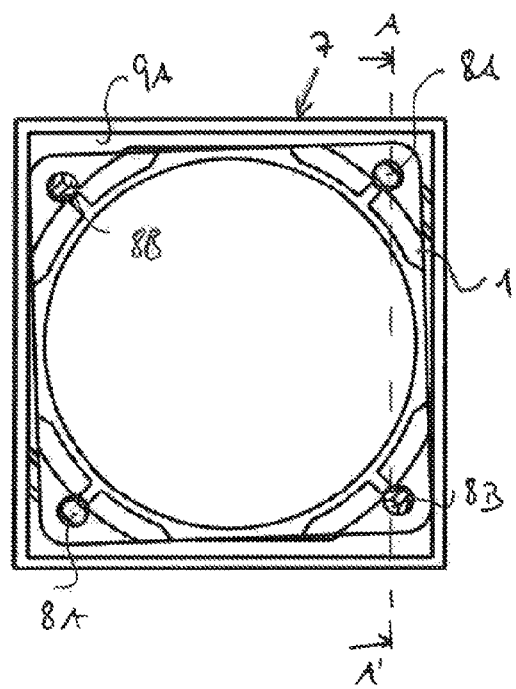

FAN ASSEMBLY FOR A COMPUTER SYSTEM AS WELL AS HOLDING DEVICE FOR A FAN ASSEMBLY

The invention relates to a fan assembly for a computer system. Furthermore, the invention relates to a holding device for such a fan assembly.

Modern computer systems are getting more and more performant, having to meet the requirements of a permanent availability at the same time. In most cases, one or multiple fans are used for cooling heat-generating components in such a computer system, the fans suctioning hot air from the respective components and blowing it out through openings in the casing. Moreover, fans that blow cool air from the surroundings of the computer system into the interior thereof in order to cool the components of the computer system are known.

Typically, the fans comprise one or multiple flanges, by means of which the fans can be mechanically secured in a computer system. Especially in the field of servers, it is desirable to be able to mount and dismount the fans without having to turn-off the entire computer system. This option is known as hot-plug function.

One object underlying the invention is to provide a concept for a fan assembly, which enables a fast and cost-efficient mounting or dismounting of a fan in a computer system.

A fan assembly for a computer system is described, the assembly comprising a fan, which has a flange having at least three fastening openings. Furthermore, the assembly comprises a holding device, which has at least two resilient first fastening elements and one second fastening element corresponding to the fastening openings. The fastening elements are arranged relative to one another in such a way that, in a relaxed state of the first fastening elements, the fan can be placed on the holding device in a first placing movement in such a way that only the first fastening elements engage in corresponding two fastening openings. The engagement is effected in a form-fit manner. After a second placing movement of the fan against a spring force of the first fastening elements, the second fastening element is aligned with the further fastening opening, so that the fan can be secured to the holding device.

The holding device is a separate element such as a holding frame, a fan bracket or the like. As an alternative, the holding device may also be formed differently, e.g. as a part of a casing wall of the computer system or the like. The resilient fastening element is a fastening element which is formed to be resilient per se or mounted in a resilient manner.

The assembly provides that in an initial state, before mounting the fan to the holding device, the fan can be oriented in relation to the holding device in such a way that only the two first fastening elements are aligned with the corresponding fastening openings of the fan. As a result, the fan can at first be placed onto the holding device in a first placing movement or placing direction only in such a way that only the two first fastening elements can engage or be inserted in the corresponding openings, while the further fastening opening is free from the second fastening element. In other words, not all of the fastening elements can be arranged to be aligned with the fastening openings in the initial state. For example, some of the fastening elements have other distances to one another in the relaxed state than the corresponding fastening openings have to one another. In other words, the arrangement of the fastening openings to one another is not congruent with the arrangement of the corresponding fastening elements to one another.

Along with the second placing movement of the fan, the fan is moved relative to the holding device, e.g. rotated or displaced with respect to this device, wherein the fan is moved against a spring force of the engaged first fastening elements. The first fastening elements are being slightly bent, for example. As a result, the second fastening element is moved into a position aligned with the further fastening opening left free so far. The fan is rotated with respect to the two first fastening elements, for example. As a result, the second fastening element can engage into the corresponding fastening opening. The engagement is effected in a form-fit manner, for example. As a result, all fastening elements are engaged with respective fastening openings of the flange. As a result, the fan can be secured to the holding device in a completely mechanical fashion.

The described fan assembly allows a fast, simple and space-saving mounting of the fan to the holding device, in which no additional elements such as rivets, spread rivets or screws are required. It is also not necessary to provide an additional snap-in latch (snap connection), which is typically provided on the outside of the fan housing of the fan, which is why no additional space requirements for potential latch hooks is needed. This achieves cost savings, in particular when considering that the fan assemblies typically are mass products.

According to one embodiment, the fan is held on the holding device via all fastening elements in mechanically secure manner after a third placing movement. For example, the fan is moved in a normal direction relative to a main extension plane of the holding device in the first placing movement, subsequently rotated or moved parallel to the main extension plane in the second placing movement, and subsequently pushed in the normal direction in the direction of the holding device in the third placing movement, in analogy to the first placing movement. As a result, it is achieved that all fastening elements are engaged with the corresponding fastening openings, e.g. plunge into the fastening openings or reach through these fastening openings. For example, the fan is held on the holding device due to effective spring forces of the first fastening elements.

Optionally, the fan latches with the holding device after the third placing movement. The fan is thereby held on the holding device in a mechanically secure fashion. For example, the first fastening elements relax after the third placing movement, so that the latch connection is achieved.

Optionally, the second fastening element has a resilient design as well. In analogy to the above, it also contributes to hold the fan and/or ensure a latch connection by means of a spring force after a third placing movement.

According to one embodiment, the fastening elements are formed in the type of pins. In other words, the fastening elements are at least partially or sectionally formed to be cylindrical or rounded. For example, this enables a rotation of the fan with respect to the first two fastening elements in the second placing movement.

According to another embodiment, the fastening elements are formed as mandrels. For example, the fastening elements comprise a tapered end in the type of a mandrel, e.g. a tip. This facilitates insertion into the fastening openings, e.g. for the second fastening element after the second placing movement.

According to another embodiment, the fastening elements may each comprise a latch element. As a result, e.g. the fastening elements can engage behind the flange of the fan in regions of the fastening openings after the third placing movement and thus latch. For example, the fastening elements comprise latch elements such as latch noses, latch hooks or other shapes.

According to another embodiment, the latch elements of the first fastening elements and the latch element of the second fastening element are directed in opposite direction with respect to a common center of the fastening elements. This contributes to a particularly secure mechanical securing of the fan to the holding device. Thus, it is in particular not possible to release the fan from the holding device in a simple manner, e.g. by a rotation in one direction.

According to another embodiment, the two first fastening elements are formed to be longer when compared to the second fastening element. As a result, the two first fastening elements can plunge into the corresponding fastening openings in the first placing movement, while the second fastening element stops against the flange without engaging into the corresponding fastening opening due to the corresponding arrangement. This contributes to the fact that the fan can be placed-on substantially parallel to the holding device.

According to another embodiment, the flange of the fan comprises four fastening openings and the holding device has two first and two second fastening elements, correspondingly. Typically, a first and a second fastening element are provided to be alternately distributed along the circumference. The above description regarding the second fastening element applies to both second fastening elements.

Furthermore, a holding device for an above-described fan assembly is disclosed. The holding device is formed in accordance with the above-described embodiments. The holding device and the fastening elements may comprise the respective described features and feature combinations in analogy to the above.

The holding device substantially enables the above described advantages and functions.

Further advantages and functions are indicated in the following description of an exemplary embodiment.

The exemplary embodiment will hereinafter be described using the attached figures. Like or equivalent elements are provided with the same reference numerals throughout the figures.

Figure 2:
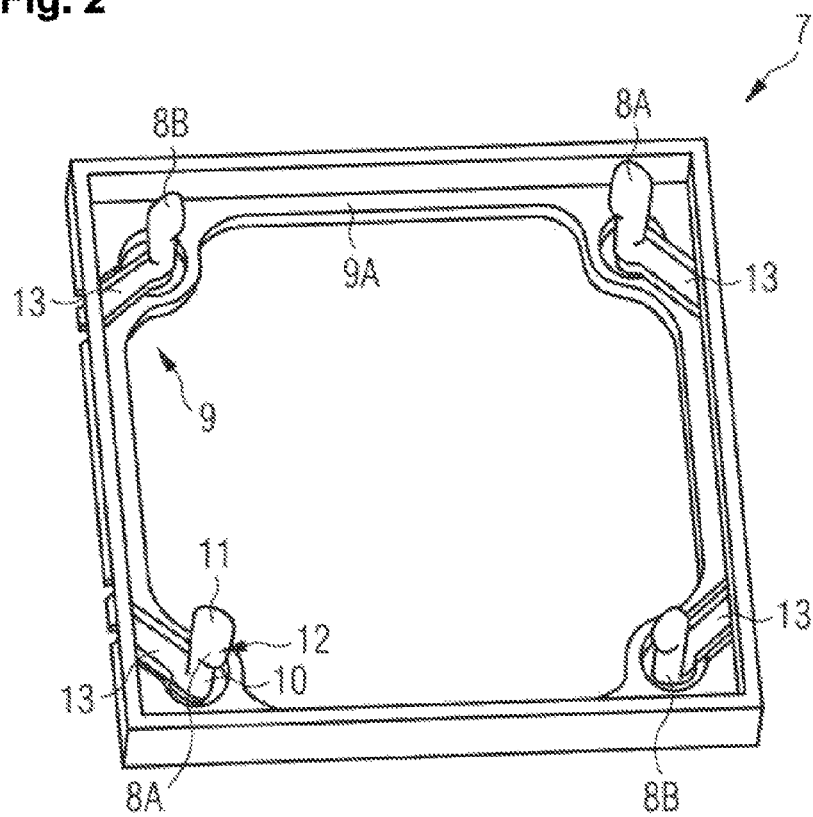
Figure 5A:
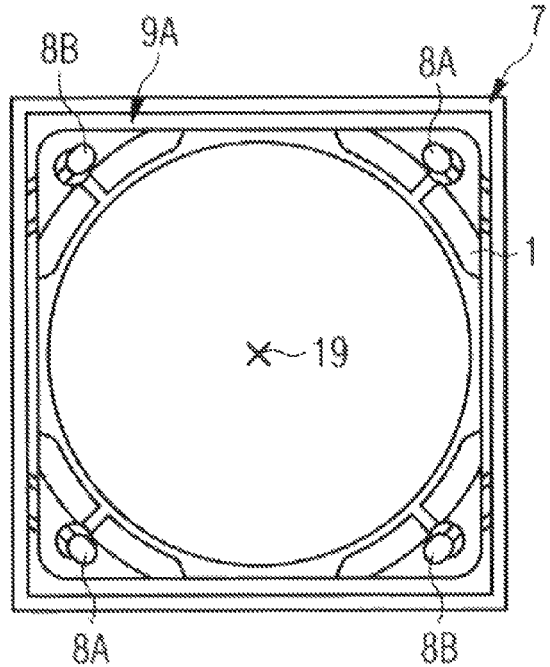
Figure 5B:
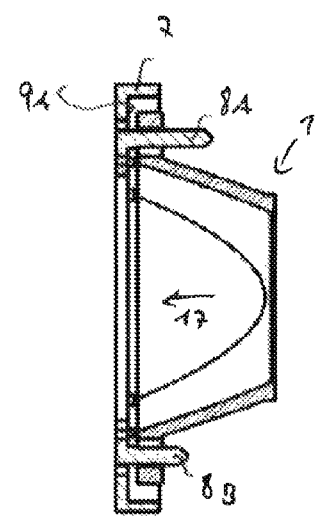
Figure 6:
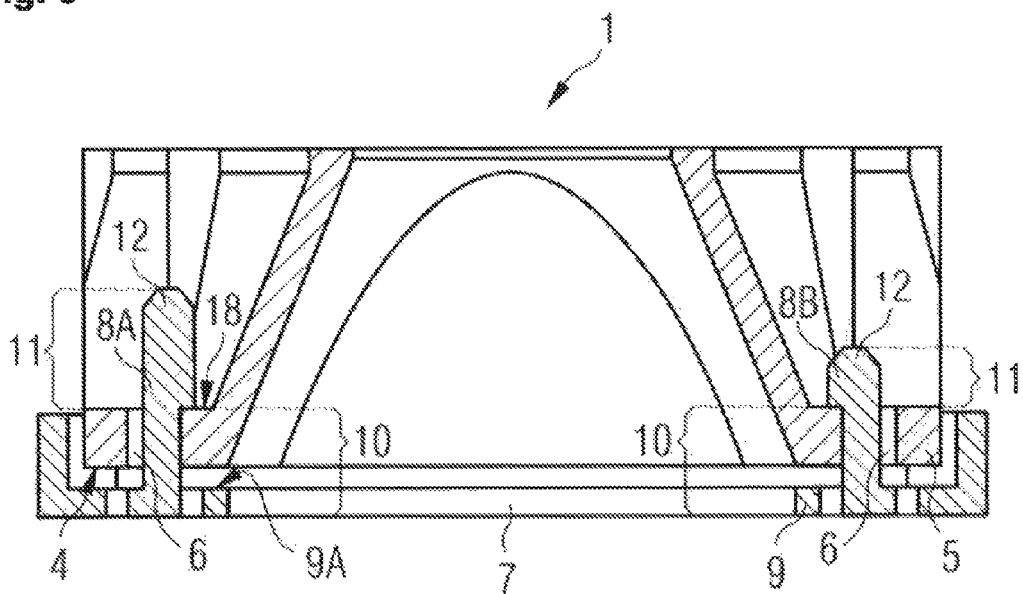

The figures show in:

FIG. 1 a perspective schematic view of a fan,

FIG. 2 a perspective schematic view of a holding device for the fan,

FIGS. 3A and 3B a plan view and a cross-sectional view of a fan assembly having the fan and the holding device in a first placing movement, FIGS. 4A and 4B a plan view and a cross-sectional view of the fan assembly in a second placing movement, FIGS. 5A and 5B a plan view and a cross-sectional view of a fan assembly in a third placing movement, and FIG. 6 an enlarged schematic cross-sectional view of the fan assembly in a fully mounted state.

FIG. 1 schematically shows a fan 1, which has a fan housing 2 having a fan rotor 3 arranged therein. The fan 1 is provided to be mounted in a computer system, e.g. a desktop PC or a server system, in order to cool heat-generating elements of the computer system. Fan 1 has a flange 5 on at least one side, here in the upper side 4, which can also be referred to as fan flange. The flange 5 is substantially formed plate-shaped having a planar surface, so that the fan 1 can be brought in contact with a counter surface for mounting. The flange 5 has four fastening openings 6 in corner regions, these fastening openings being through openings. A fan grate can be mounted via the fastening openings 6, for example. As an alternative, as will be described hereinafter, the fan 1 can be mounted on a holding device via the fastening openings 6.

FIG. 2 shows a holding device 7, on which the fan 1 can be secured. The holding device 7 is formed as a fan support or fan bracket, and made of a plastic material in the exemplary embodiment. The holding device 7 has two first fastening elements 8A as well as two second fastening elements 8B, which are commonly referred to as fastening elements 8. The fastening elements 8 are arranged in corner regions of the holding device 7. Incidentally, a first and a second fastening element 8A, 8B, respectively, are alternately provided clockwise or counterclockwise.

The holding device 7 comprises a frame having an internal structure 9, which has a surface 9A assigned to the fan 1, e.g. facing the fan 1 in a mounted state.

The fastening elements 8 are configured to cooperate with the fastening openings 6 and thus the fan flange 5, so that the fan 1 can be secured to the holding device 7 without tools and without additional fastening elements. The fastening elements 8 are formed as pins or mandrels and extend normally from the surface 9A of the structure. Starting from the structure 9, the fastening elements 8 have at least two sections, of which a first section 10 is formed cylindrically and has a smaller diameter than the following second section 11. In the exemplary embodiment, the second section is not cylindrical, but has a substantially oval cross-section. However, this is not mandatory. The transition from the first section 10 to the second section 11 is defined by a shoulder or a step. Thus, the second section represents a latch element 12 in the form of a latch hook.

All fastening elements 8 are arranged in a resilient fashion. In the exemplary embodiment, the holding device 7 comprises resilient tabs 13, which are formed in the structure 9. The tabs 13 can also be referred to as resilient tongues. The resilient tabs 13 have the fastening elements 8 as an integral part. All fastening elements 8 are elastically at least slightly moveable or bendable in all spatial directions.

The mounting process of the fan 1 is described by means of FIGS. 3A to 6. The figure pairs 3A and 3B, 4A and 4B as well as 5A and 5B show the fan assembly in three different states, wherein the figures indicated with the "A" suffix 3A, 4A, and 5A show schematic plan views of the fan assembly in the direction of the surface 9A of the holding device 7, while the FIGS. 3B, 4B, and 5B indicated with the "B" suffix show schematic cross-sectional views corresponding to the sectional planes A-A', B-B', C-C'.

For fastening the fan 1 on the holding device 7, the fan 1 is initially oriented in such a way that substantially the fastening openings 6 are opposite the fastening elements 8.

As can be seen by means of FIG. 3A and the corresponding FIG. 3B, the fastening elements 8 are arranged relative to one another in such a way that it is not possible in a relaxed state of the fastening elements 8 to orient all fastening elements 8 to align with the fastening openings 6 of the fan 1. In other words, it is not possible to plug the fan 1 directly on the holding device 7 in a single placing movement with all fastening elements 8 engaging in the fastening openings 6. As can be seen from FIGS. 3A and 3B, the fastening elements 8 are arranged asymmetrically (in terms of axis symmetries) so that merely the first fastening elements 8A can engage in the corresponding fastening openings 6. In contrast, the second fastening elements 8B are arranged slightly offset with respect to the corresponding fastening openings 6.

In a first placing movement 14, which goes in the normal direction toward the surface 9A or the holding device 7, the fan 1 is plugged on the holding device 7 with only the first fastening elements 8A engaging in the corresponding fastening openings 6.

As can be seen from FIG. 3B, the first fastening elements 8A are longer compared to the second fastening elements 8B with respect to the normal direction to the holding device 7. As a result, in the first placing movement 14, only the first fastening elements 8A engage in the openings 6, while the second fastening elements 8B represent a stop due to the offset arrangement of these elements, so that the first placing movement 14 is restricted. Thus, at the end of the first placing movement 14, the first fastening elements 8A plunge into the fastening opening 6, while the second fastening elements 8B stop against the upper side 4 of the flange 5 of the fan 1.

As shown in FIGS. 4A and 4B, the fan 1 is moved in accordance with a second placing movement 14. The second placing movement 15 is a rotation clockwise or counterclockwise about an axis of rotation 16, which extends normally to the holding device 7 and substantially centrally between the two first fastening elements 8A. In other words, the fan 1 is rotated about the first fastening elements 8A, which are plunged into the fastening openings 6. Due to the elasticity, the first fastening elements 8A slightly yield elastically, so that the second fastening elements 8B are aligned with the corresponding fastening openings 6. As a result, the second fastening elements 8B engage the corresponding fastening openings 6. Due to the guiding effect for the second placing movement 15, the first fastening elements 8A can also be referred to as guide elements or guide mandrels. In other words, the resilient design of the fastening elements 8 allows the rotation of the fan 1, wherein the fastening elements 8, in particular the first fastening elements 8A, are being bent.

Subsequently, in a third placing movement 17, as illustrated by means of FIGS. 5A and 5B, the fan 1 is pressed against the holding device 7. This third placing movement 17 substantially corresponds to the first placing movement 14. In the third placing movement 17, all fastening elements 8 plunge through the corresponding fastening openings 6 in such a way that the second sections 11 of the fastening elements 8, which are formed as latch hooks, engage behind the flange 5 of the fan 1 and latch with the fan 1. Accordingly, the second fastening elements 8B can also be referred to as holding mandrels. For latching, the fastening elements 8, in particular the first fastening elements 8A, spring back into their relaxed state. This ensures that the fan 1 cannot detach from the holding device 7 in an undesirable manner.

The fully mounted state is once again shown in detail in FIG. 6, which shows a cross-section of the mounted fan assembly. Here, it can be discerned that the second sections 11 of the fastening elements 8 are completely plunged through the fastening openings 6 after the third placing movement 17, are relaxed against corresponding spring forces and engage behind the flange 5 on a bottom side 18. As a result, the fan 1 latches with the holding device 7 and is securely held therein.

The latch elements 12 of the first fastening elements 8A are essentially opposite to the latch elements 12 of the second fastening elements 8B. In other words, the latch elements 12 of the two groups of fastening elements 8 point in opposite directions with respect to a virtual circular path having a common center 19, on which the fastening elements 8 are located (see FIG. 5A). Due to this arrangement, the fan 1 is securely held in position without additional parts.

The above-mentioned advantages of a simple mounting by means of a latch connection without additional parts for the fastening of the fan 1 are made possible by the described assembly. Additional space requirements for latch connections on the outside of the fan housing are superfluous.

The dismounting of also achieved in simple ways and manners, with the fan 1 being detached from the holding device 7 by rotation and pulling-off with respect to the holding device 7, e.g. by reversing the placing movements 14, 15 and 17 or other sequence thereof.

In the exemplary embodiment, the fan 1 is mounted in the holding device 7. The holding device is formed as a holding frame. In an exemplary embodiment, which is not shown, the holding device 7 can also be formed as a part of a casing or support sheet of a computer system, this system comprising the four fastening elements 8 corresponding to the described assembly. In other words, it is not necessarily required for the holding device 7 to comprise a separate support frame. The decisive factor is that the fastening elements 8 are formed in a corresponding arrangement relative to one another, so that the fan 1 can be plugged on these fastening elements.

LIST OF REFERENCE NUMERALS 1 fan
2 fan housing
3 fan rotor
4 upper side
5 flange
6 fastening opening
7 holding device
8, 8A, 8B fastening element
9 structure
9A surface
10 first section
11 second section
12 latch element
13 resilient tab
14 first placing movement
15 second placing movement
16 axis of rotation
17 third placing movement
18 bottom side
19 center
A-A' sectional plane
B-B' sectional plane
C-C' sectional plane

The invention claimed is:
1. Fan assembly for a computer system, comprising
a fan, which has a flange having at least three fastening openings; and
a holding device, which has, corresponding to the fastening openings, at least two spring-loaded first fastening elements and a second fastening element; wherein the fastening elements are arranged relative to one another such that
in a relaxed state of the first fastening elements, in a first placing movement the fan can be placed on the holding device such that only the first fastening elements engage into respective two fastening openings; and
after a second placing movement of the fan against a spring force of the first fastening elements, the second fastening element is aligned with the further fastening opening so that the fan can be fixed to the holding device.

2. Assembly according to claim 1,
wherein, after a third placing movement, the fan is held on the holding device in a mechanically safe manner via all fastening elements.

3. Assembly according to claim 2,
wherein the fan latches with the holding device after the third placing movement.

4. Assembly according to claim 1,
wherein the fastening elements have a pin-type design.

5. Assembly according to claim 1,
wherein the fastening elements are designed as mandrels.

6. Assembly according to claim 1,
wherein the fastening elements each have a latch element.

7. Assembly according to claim 6,
wherein the latch elements of the first fastening elements and the latch element of the second fastening element point in opposite directions with respect to a common center of the fastening elements.

8. Assembly according to claim 1,
wherein the two first fastening elements are designed to be longer compared to the second fastening element.

9. Assembly according to claim 1,
wherein the flange of the fan has four fastening openings and the holding device has two first and two second fastening elements corresponding thereto.

10. Holding device for a fan assembly according to claim 1, comprising at least two spring-loaded first fastening elements and a second fastening element, which are corresponding to fastening openings of a fan; wherein the fastening openings are arranged relative to one another such that in a relaxed state of the first fastening elements, the fan can be placed on the holding device in a first placing movement such that only the first fastening elements engage into respective two fastening openings; and after a second placing movement of the fan against a spring force of the first fastening elements, the second fastening element is aligned with the further fastening opening so that the fan can be fixed to the holding device.

\* \* \* \* \*